(12) United States Patent
Buttle et al.

(10) Patent No.: US 8,149,331 B2
(45) Date of Patent: Apr. 3, 2012

(54) DELAY STABILIZATION METHOD AND APPARATUS FOR VIDEO FORMAT CONVERSION

(75) Inventors: Ken Gordon Buttle, Folsom, CA (US); Tim John Lascano Callahan, Grass Valley, CA (US)

(73) Assignee: GVBB Holdings S.A.R.L, Luxembourg (LU)

( * ) Notice: Subject to any disclaimer, the term of this patent is extended or adjusted under 35 U.S.C. 154(b) by 1342 days.

(21) Appl. No.: 11/809,638

(22) Filed: May 31, 2007

(65) Prior Publication Data

US 2008/0297652 A1  Dec. 4, 2008

(51) Int. Cl.
*H03L 7/00* (2006.01)
(52) U.S. Cl. .......... 348/537; 348/445
(58) Field of Classification Search ............ 348/441, 348/445, 536, 537; 345/215
See application file for complete search history.

(56) References Cited

U.S. PATENT DOCUMENTS

| | | | |
|---|---|---|---|
| 6,791,623 | B1 | 9/2004 | Masuda et al. |
| 6,919,929 | B1 | 7/2005 | Iacobelli et al. |
| 7,071,992 | B2 * | 7/2006 | Chen et al. ............ 348/441 |
| 2004/0047593 | A1 | 3/2004 | Ota |

FOREIGN PATENT DOCUMENTS

| | | |
|---|---|---|
| EP | 0963120 | 8/1999 |
| EP | 0979000 | 9/2000 |
| JP | 7059055 | 3/1995 |
| JP | 7184117 | 7/1995 |
| JP | 08125943 | 5/1996 |
| JP | 09258904 | 10/1997 |
| JP | 10340074 | 12/1998 |
| JP | 2000232630 | 8/2000 |
| JP | 2001045372 | 2/2001 |
| JP | 2003005694 | 1/2003 |
| JP | 2003115828 | 4/2003 |

OTHER PUBLICATIONS

Predelia P. Single-chip digital stereo system. Pub. 1996.

* cited by examiner

*Primary Examiner* — Andrew Koenig
*Assistant Examiner* — Jasmine Stokely-Collins
(74) *Attorney, Agent, or Firm* — Arent Fox, LLP

(57) ABSTRACT

A method for stabilizing delay during conversion between Standard Definition (SD) video and High Definition (HD) video includes the step of establishing an integer divide ratio (M/N) corresponding to a ratio of clock rates with the output and input formats. The output clock rate is generated from the input clock rate by a Phase Lock Loop (104) using the M/N divide ratio to provide a known phase relationship between the two clocks rates at a repetitive interval. The video frame can be transferred at the known repetitive interval to provide coarse control over the input-to-output video delay. A separate fine tuning control (delay block) is provided to enable any programmable delay in video throughput to be accommodated to an accuracy of ±0.5 output pixel periods.

12 Claims, 3 Drawing Sheets

DELAY STABILIZATION METHOD AND APPARATUS FOR VIDEO FORMAT CONVERSION

FIELD OF THE INVENTION

The present principles relate to video format conversion. More particularly, they relate to delay stabilization during video format conversion from high definition (HD) to standard definition (SD), and vice versa.

DESCRIPTION OF THE PRIOR ART

Video format conversion often becomes necessary during video processing, especially due to the emergence of high Definition (HD) broadcasting. However, at the current time, not all broadcasts occur in HD and therefore, most broadcasters provide a combination of Standard definition (SD) and HD format content.

When performing video format conversion from a high-definition (HD) format to a standard definition (SD) format, or vice versa, maintaining a fixed input to output signal delay every time powered up occurs can prove difficult because of the difference in SD and HD pixel clock rates. Consistent and sustainable video delay must exist to maintain time synchronization among video and associated audio and/or data paths, in a broadcast switching environment.

Previous methods for performing video format conversion included measuring the processing delay of a scaler function and adding more output video delay to provide the desired throughput delay. However, this reliance on the scaler produces variations in the throughput delay of up to ±2 output video pixel periods.

Thus, a need exists for a method for increasing the stabilization of the signal delay during power converter power up for video format conversion from HD to SD or vice versa.

BRIEF SUMMARY OF THE INVENTION

It is an aspect of the present principles to provide improved delay stabilization for in video format conversion.

This and other aspects are achieved in accordance with an implementation of the present principles, wherein a method for stabilizing delay during conversion of a video frame from a first format to a second format includes the steps of: establishing an integer divide ratio (M/N) corresponding to the ratio of a clock rate associated with the second format to a clock rate associated with the first format, generating an output clock rate from the first format pixel clock rate using the integer divide ratio to provide a known phase relationship between the two clocks rates at a repetitive interval, and transferring a video frame at the repetitive interval to provide control over delay between a frame of video in the first format and the frame converted to the second format.

Applying a fine tuning output trim delay to the transferred video frame will provide fine control over the video delay.

Other objects and features of the present principles will become apparent from the following detailed description considered in conjunction with the accompanying drawings. It is to be understood, however, that the drawings are designed solely for purposes of illustration and not as a definition of the limits of the present principles, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings wherein like reference numerals denote similar components throughout the views.

DETAILED DESCRIPTION

As mentioned above, when performing video format conversion from HD to SD or vice versa, maintaining the relationship between a first format (e.g., input) signal to second format (output) signal delay upon of power-up due can prove difficult because of the difference in SD and HD pixel clock rates. In accordance with an aspect of the present principles, the a video format conversion method described hereinafter provides for "coarse" control over the input-to-output video delay, and utilizes a separate output fine tuning delay block to provide the "fine" delay control.

Figure 1:
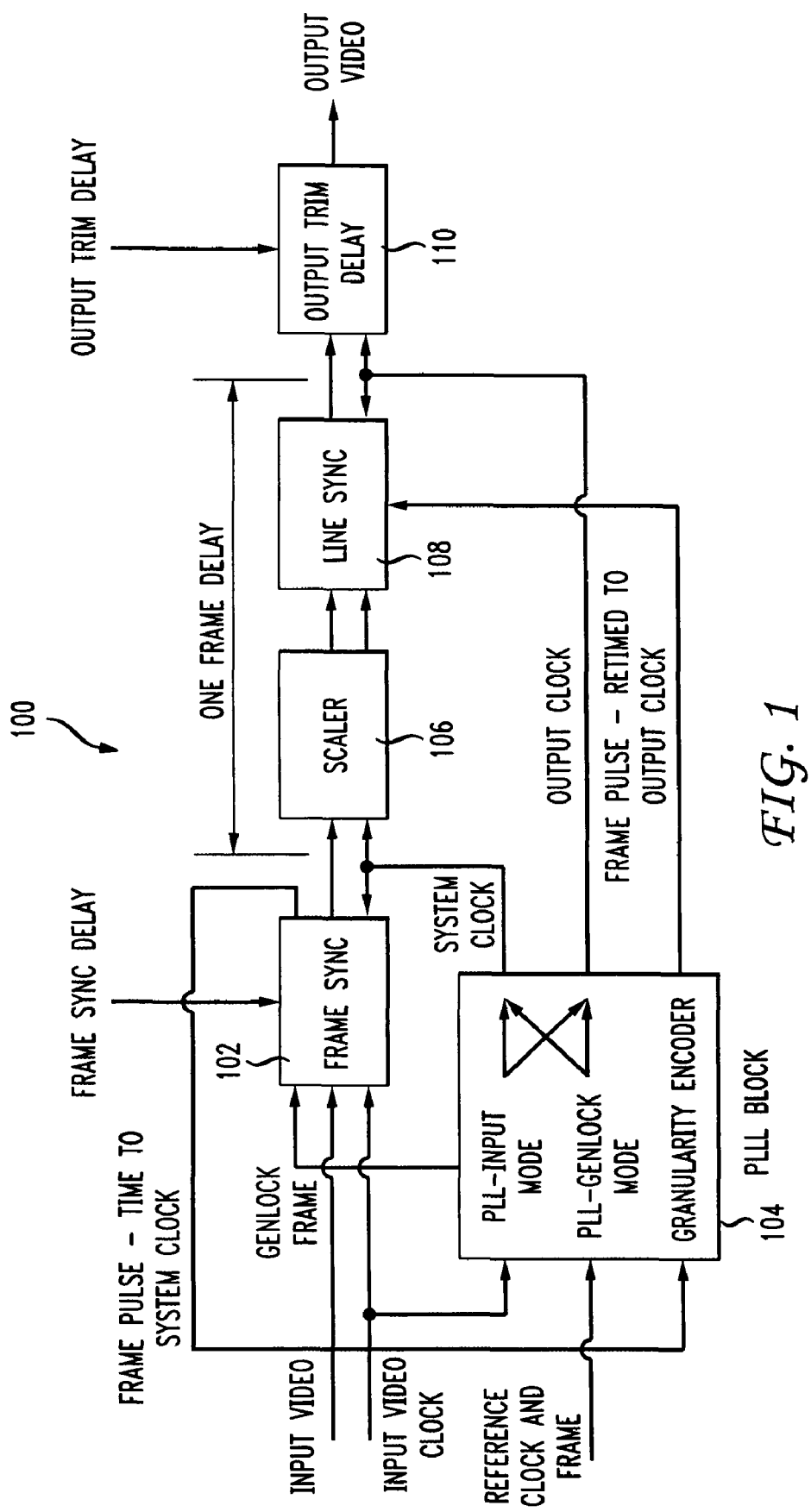
FIG. 1 illustrates block diagram of a video format converter implementing the delay stabilization method according to an aspect of the present principles.

FIG. 1 shows a system level view of a video format converter 100 implementing the method of the present principles. The video format converter 100 includes a frames sync 102, a phase lock loop (PLL) 104, a scaler 106, a line sync 108 and an output trim delay 110. The frame sync 102 operates to align the output video to either: 1) the input video timebase; or 2) a genlock timebase derived from an analog reference signal. Generally, a user will select which alignment will occur. The output of the frame sync 102 is timed to the system clock output of the PLL 104 and locked to either the input video or the genlock source depending on the PLL.

The PLL block 104 includes a phase lock loop, a clock and associated clock dividers and a frame pulse transfer function (not shown). The system clock from the PLL 104 drives the timing of the frame sync 102 output and also the scaler 106 input. The clock rate of the PLL corresponds to the video output pixel rate, and drives the timing of the scaler output 106, the line sync 108 and the trim delay 110.

In accordance with one aspect of the present principles, the phase locked loop 104 makes use of an integer ratio divide ratio (M/N) where M and N constitute the clock rate associated with the second format (e.g., the output clock rate) and the clock rate associated with the first format (e.g., the input clock rate), respectively to generate the output pixel clock from the input pixel clock. Using this integer divide ratio guarantees that the phase relationship between the two clocks remains known at a repetitive interval. Transfer of a video frame at this known interval provides the "coarse" control over the input-to-output video delay. "Fine" delay control is achieved with a delay circuit 110 that works only on the output video at the output video clock rate. By using the PLL phase detector and clock dividers within the PLL 104 to create a frame pulse transfer mechanism, and the separate output fine-tuning delay block (trim delay 110), any programmable delay in video throughput may be accommodated to an accuracy of +/−0.5 output pixel periods.

In accordance with one aspect of the present principles, the following format conversions can occur using an M/N synthesis circuit to produce the output clock (from the PLL). An example of such a circuit is an M/N clock synthesis circuit using a Costas loop. Those of skill in the art are familiar with these types of circuits, and as such further description of the same is not warranted.

TABLE 1

| | Input Video Format | Input Pixel Rate | Output Video Format | Output Video Rate | M/N |
|---|---|---|---|---|---|
| 1 | HD59.94 | 74.25 MHz/1.001 | SD59.94 | 27 MHz | 91/250 |
| 2 | HD50 | 74.25 MHz | SD50 | 27 MHz | 80/220 |
| 3 | SD59.94 | 27 MHz | HD59.94 | 74.25 MHz/1.001 | 250/91 |
| 4 | SD50 | 27 MHz | HD50 | 74.25 MHz | 220/80 |

In the examples #2 and #4 above, the M/N ratio could be further simplified, but has been retained here for purposes of exemplifying the present principles and showing that the phase detect frequency is roughly the same frequency range as for examples #1 and #3. For case #1, every 250 cycles of the HD clock and every 91 cycles for the SD pixel clock, the rising edges of the two clocks have zero phase difference.

Figure 2:
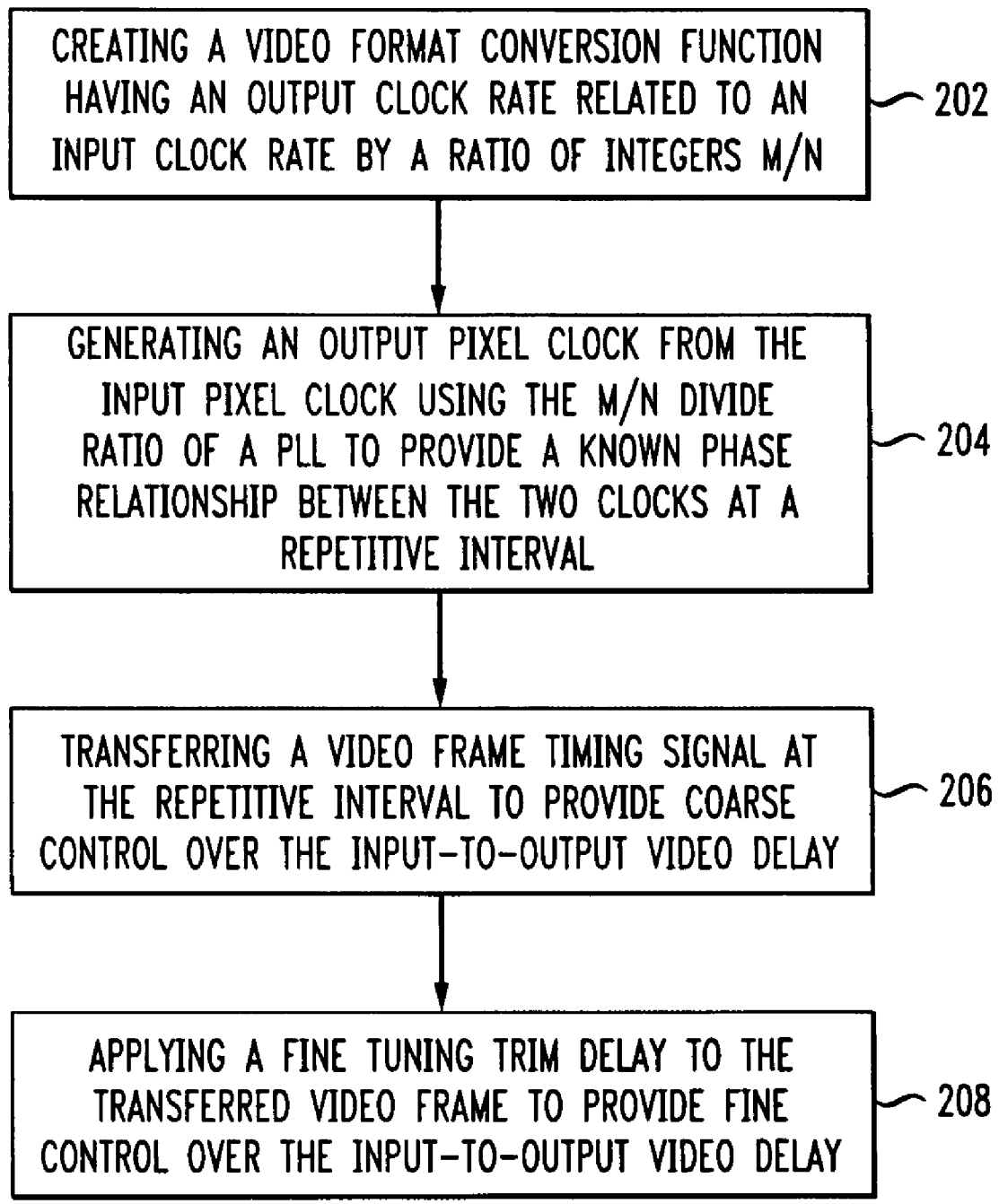
FIG. 2 illustrates a flow chart diagram of the steps of a method for video format conversion according to an aspect of the present principles.

FIG. 2 shows a flow diagram of the steps of the method of the present principles. Initially, a video format conversion function is created having an output clock related to an input clock by a ratio of integers M/N (202). An output pixel clock is generated from the input pixel clock using the M/N divide ratio of a PLL to provide a know phase relationship between the two clocks at a repetitive interval (204). This provides a known phase relationship between the two clocks at a repetitive interval. In accordance with one implementation, the repetitive interval is less than both the input and output video line period, with a whole number of such intervals in an input or output video frame.

Once this interval is determined, the video frame timing signal is transferred at the known repetitive interval to provide coarse control over the input-to-output video delay (206). Once the coarse control is achieved, a fine tuning trim delay can be applied to the transferred video frame to provide fine control over the input-to-output video delay (208).

Figure 3:
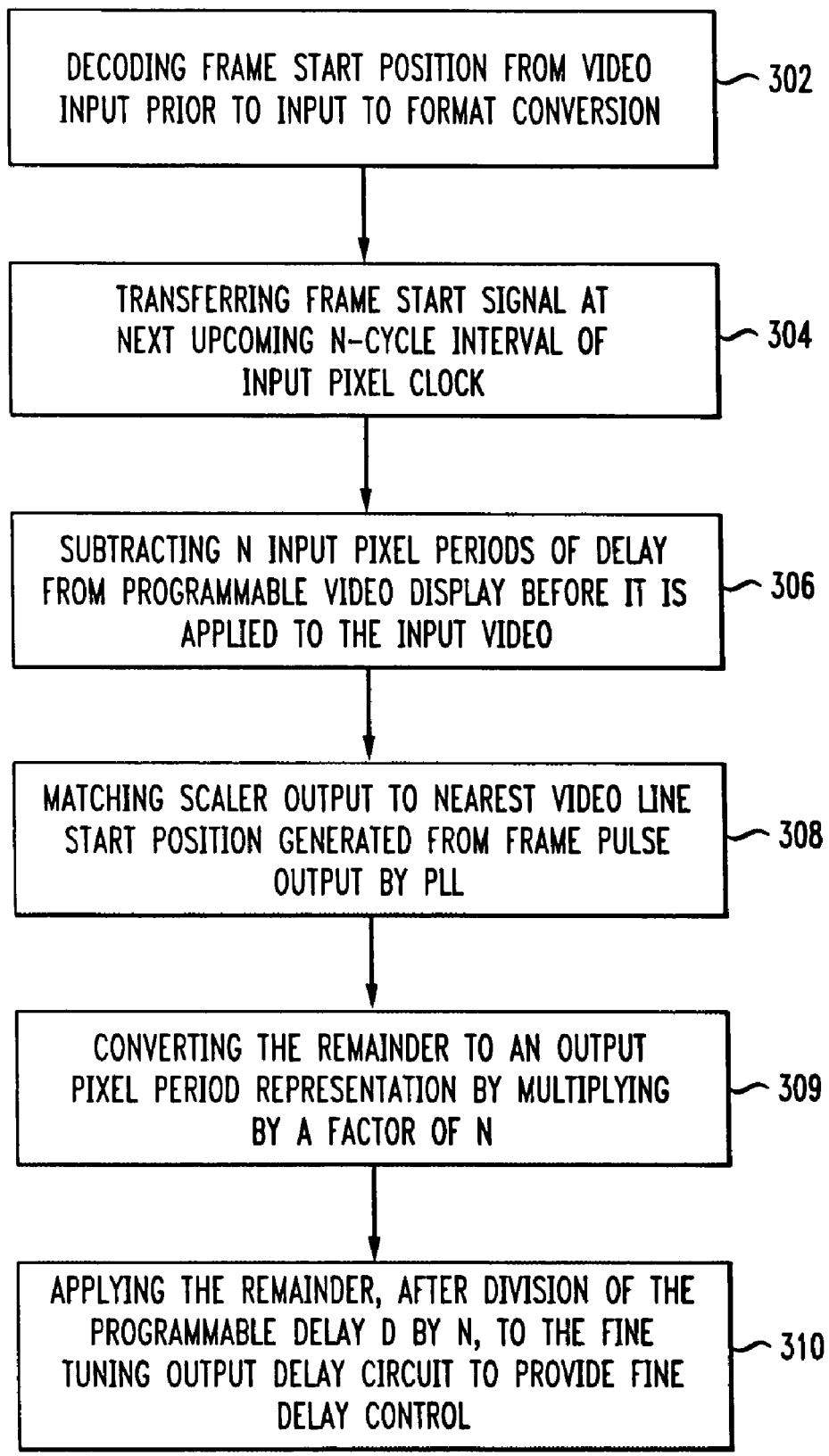
FIG. 3 illustrates a flow diagram of the method for video format conversion according to a further aspect of the present principles.

The PLL block 104 of FIG. 1 receives the input video clock, a reference clock and frame and the frame pulse timed to the system clock from the frame sync 102 of FIG. 1. In order to create the frame pulse transfer mechanism of the present principles, the frame start position is decoding the frame sync (Step 302 in FIG. 3) from the video just before input to the scaler circuit 106 of FIG. 1. Due to the user-programmable delay of this video signal, this decoded frame start position signal can be anywhere in a one-frame period, to within one-pixel-period resolution.

By transferring the frame start signal at the next upcoming N-cycle interval of the input pixel clock (Step 304 in FIG. 3); a coarse delay granularity is affected. In anticipation of that extension in time of the frame start position to the output timebase, the programmable video delay, in input pixel periods, must have N input pixel periods of delay subtracted from it before application to the input video in the line sync 108 (Step 306 in FIG. 3). Those of skill in the art will recognize that that this subtraction can be performed in software before writing the delay to the hardware.

The line sync circuit 108 of FIG. 1 receives a video input from the scaler 106 of FIG. 1, and the frame pulse input, both of which are retimed to the output clock from the PLL block 104. The line sync circuit 108 is a variable delay buffer that matches up the scaler output to the nearest video line start position generated from the frame pulse received from the PLL block 104 (Step 308 in FIG. 3). The Remainder is then converted by the output trim delay to an output pixel period representation by multiplying by a factor of N (Step 309 of FIG. 3).

The output trim delay circuit 110 receives the output of the line sync 108 along with the output clock from the PLL block 104 and the user input output trim delay to provide the output video in accordance with the present principles. The remainder after division of the programmable delay in input pixel periods is a natural number in the range of $0 \leq R \leq N$. This number must be converted through multiplication by M/N to be in terms of output pixel periods, and is then applied to the fine-tuning output delay circuit 110 (step 310 of FIG. 3) to provide the "fine" delay control of the present principles.

By way of example, for a desired programmable delay "D" in input pixel periods, applied to a video format converter circuit (e.g., circuit 100) with (output pixel rate)/(input pixel rate) ratio of M/N, the following equations are used to provide a stable and reproducible delay "G", accurate to ±0.5 output pixel periods, according the present principles:

$C = \text{int}((D-N)N)$, where C is the Coarse Delay in Input Pixel Periods, and the "int" operation truncates the operand to a whole number.

$F = ((D) \text{modulo}(N)) * M/N$, where F is the Fine Delay in Output Pixel Periods, and the "modulo" operation produces the remainder after division of D by N.

Thus, $G = C*M/N + F$, which provides the total delay through the circuit, accurate to less than one-half of one output pixel period.

It should be understood that the present principles are described in terms of a system and method for video format conversion from SD to HD, or vice versa; however, the present principles are much broader and may include any video format conversion where the pixel clock rates between formats to be converted are different. The present principles are described in terms of method steps and software components; however, the concepts of the present principles may be extended to other video format conversions and methods.

It should be understood that the elements shown in the Figs. may be implemented in various forms of hardware, software or combinations thereof. Each element may be implemented in any combination of hardware and software, which may be executed on one or more appropriately programmed general-purpose computing devices. The general computing devices may include any combination of any known, or as yet undiscovered, processor, memory or input/output interfaces.

The functions of the various elements shown in the figures may be provided through the use of dedicated hardware as well as hardware capable of executing software in association with appropriate software. When provided by a processor or element, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any elements shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, but not limited to, for example, a combination of circuit elements that performs that function or software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. Any means that can provide those functionalities are equivalent to those shown herein.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended to aid the reader in understanding the present principles and the concepts contributed by the inventor to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, such equivalents may include both currently known equivalents as well as equivalents as yet undeveloped, including any elements developed in the future that perform the same function, regardless of structure.

While there have been shown, described and pointed out fundamental novel features of the present principles, it will be understood that various omissions, substitutions and changes in the form and details of the methods described and devices illustrated, and in their operation, may be made by those skilled in the art without departing from the spirit of the same. For example, it is expressly intended that all combinations of those elements and/or method steps which perform substantially the same function in substantially the same way to achieve the same results are within the scope of the present principles. Moreover, it should be recognized that structures and/or elements and/or method steps shown and/or described in connection with any disclosed form or implementation of the present principles may be incorporated in any other disclosed, described or suggested form or implementation as a general matter of design choice. It is the intention, therefore, to be limited only as indicated by the scope of the claims appended hereto.

The invention claimed is:

1. A method for stabilizing delay during format conversion of incoming video, the method comprising the steps:
   decoding a frame start position from the incoming video;
   transferring a frame start signal at a next upcoming predetermined (N) cycle interval of an input clock;
   subtracting N input pixel periods of delay from a programmable video delay prior to application to the incoming video;
   matching a scaler output to a nearest video line start position; and
   applying a remainder, after division of the programmable delay by N, to provide fine delay control.

2. The method of claim 1, further comprising converting the remainder to an output pixel period representation by multiplying by the factor N before said step of applying.

3. A method for stabilizing delay during conversion of incoming video from a first format to a second format, each having associated clock rates, the method comprising the steps:
   establishing an integer divide ratio (M/N) corresponding to a ratio of clock rates associated with the second format and first formats;
   generating an output clock rate from the first format clock rate using the integer divide ratio to provide a known phase relationship between the two clocks rates at a repetitive interval; and
   transferring a video frame at the repetitive interval to provide control over video delay,
   wherein said establishing and said generating steps further comprise:
      decoding a frame start position from an input video stream;
      transferring a frame start signal at a next upcoming predetermined (N) cycle interval of the first format clock rate;
      subtracting N input pixel periods of delay prior to application of the incoming video; and
      matching a scaler output to a nearest video line start position.

4. The method of claim 3, further comprising:
   applying a fine tuning output trim delay to the transferred video frame to provide fine control over the video delay.

5. The method of claim 4, wherein said applying is performed on the transferred video frame at the output clock rate.

6. The method of claim 3, further comprising determining a remainder, after division of a programmable delay (D) by a predetermined cycle interval (N), and applying the remainder to fine tune the video delay.

7. The method of claim 3, further comprising aligning the transferred video frame video to one of the incoming video time base or a genlock time base derived from a received video reference signal.

8. The method of claim 3, wherein said repetitive interval is less than both first and second format video line periods.

9. An apparatus for stabilizing delay during conversion of incoming video from a first format to a second format, each having associated clock rates, comprising:
   a phase lock loop block for: (a) establishing an integer divide ratio (M/N) corresponding to a ratio of clock rates associated with the second format and first formats; and (b) generating the an output clock rate from the first format clock rate using the integer divide ratio to provide a known phase relationship between the two clock rates at a repetitive interval;
   means for decoding a frame start position from the incoming video;
   means for transferring a frame start signal at a next upcoming predetermined (N) cycle interval of the first format clock rate;
   means for subtracting N input pixel periods of delay from a programmable video delay prior to application to the incoming video; and
   means for matching a scaler output to a nearest video line start position generated from the phase lock loop block; and
   means for transferring of a video frame timing signal at the repetitive interval to provide coarse control over an input-to-output video delay.

10. The apparatus of claim 9, further comprising:
   means for applying a fine tuning output trim delay to the transferred video frame to provide fine control over the input-to-output video delay.

11. The apparatus of claim 9, further comprising:
means for determining a remainder, after division of the programmable delay (D) by the predetermined cycle interval (N); and
means for applying the remainder to a fine tuning output delay circuit.

12. The apparatus of claim 9, further comprising means for aligning output video to one of an input video time base or a genlock time base derived from a received video reference signal.

* * * * *